United States Patent
Chen et al.

(10) Patent No.: US 11,411,039 B2
(45) Date of Patent: Aug. 9, 2022

(54) STACKED PIXEL STRUCTURE FORMED USING EPITAXY

(71) Applicant: Applied Materials, Inc., Santa Clara, CA (US)

(72) Inventors: Papo Chen, San Jose, CA (US); John Boland, Santa Clara, CA (US); Schubert S. Chu, San Francisco, CA (US); Errol Antonio C. Sanchez, Santa Clara, CA (US); Stephen Moffatt, St. Brelade (JE)

(73) Assignee: Applied Materials, Inc., Santa Clara, CA (US)

( * ) Notice: Subject to any disclaimer, the term of this patent is extended or adjusted under 35 U.S.C. 154(b) by 73 days.

(21) Appl. No.: 16/878,142

(22) Filed: May 19, 2020

(65) Prior Publication Data

US 2021/0366976 A1    Nov. 25, 2021

(51) Int. Cl.
*H01L 31/18*        (2006.01)
*H01L 27/146*       (2006.01)

(52) U.S. Cl.
CPC .... *H01L 27/14647* (2013.01); *H01L 27/1463* (2013.01); *H01L 27/14629* (2013.01); *H01L 27/14685* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 6,455,908 B1 | 9/2002 | Johnson et al. | |
| 6,958,862 B1 | 10/2005 | Joseph | |
| 8,686,479 B2 | 4/2014 | Hynecek | |
| 2007/0148808 A1* | 6/2007 | Lee | H01L 27/1463 438/69 |
| 2008/0067499 A1* | 3/2008 | Maa | B82Y 20/00 257/E31.011 |
| 2010/0163285 A1* | 7/2010 | Marinero | H05K 1/09 174/257 |
| 2012/0193608 A1* | 8/2012 | Forrai | B82Y 20/00 257/14 |
| 2014/0319464 A1* | 10/2014 | Iguchi | B82Y 20/00 438/98 |
| 2018/0081099 A1 | 3/2018 | Toda | |
| 2018/0294305 A1 | 10/2018 | Janssens et al. | |

FOREIGN PATENT DOCUMENTS

| | | |
|---|---|---|
| JP | 2006245088 | 9/2006 |
| KR | 20080061434 | 7/2008 |

OTHER PUBLICATIONS

International Search Report and Written Opinion for PCT/US2021/028867 dated Aug. 17, 2021.

* cited by examiner

*Primary Examiner* — Ali Naraghi
(74) *Attorney, Agent, or Firm* — Patterson + Sheridan, LLP

(57) ABSTRACT

Generally, examples described herein relate to methods and processing chambers and systems for forming a stacked pixel structure using epitaxial growth processes and device structures formed thereby. In an example, a first sensor layer is epitaxially grown on a crystalline surface on a substrate. A first isolation structure is epitaxially grown on the first sensor layer. A second sensor layer is epitaxially grown on the first isolation structure. A second isolation structure is epitaxially grown on the second sensor layer. A third sensor layer is epitaxially grown on the second isolation structure.

19 Claims, 10 Drawing Sheets

STACKED PIXEL STRUCTURE FORMED USING EPITAXY

BACKGROUND

Field

Examples described herein generally relate to the field of semiconductor processing, and more specifically, to forming a stacked pixel structure using epitaxial growth processes.

Description of the Related Art

Image sensors are commonly used in various applications such as digital cameras. An image sensor generally includes multiple pixel sensors that are arranged in an array. Light is reflected or generated from one or more objects and received by the image sensor. The image sensor provides signal outputs that have magnitudes that correspond to the light intensity level for each pixel sensor within the array.

Conventional color image sensors use a color filter mosaic to select different wavelength bands at different photodiode locations. The photodiodes for these color filter mosaics are arranged to detect as wide a range of the color spectrum as possible while using color filters to limit the detection to a single desired color. One example of a color filter mosaic is the Bayer color filter array. More recent color image sensors have moved towards stacking pixels that detect different colors. However, these more recent image sensors have encountered manufacturing issues that could prohibit wide-scale implementation of these image sensors.

SUMMARY

Examples of the disclosure include a method for semiconductor processing. A first sensor layer is epitaxially grown on a crystalline surface on a substrate. A first isolation structure is epitaxially grown on the first sensor layer. A second sensor layer is epitaxially grown on the first isolation structure. A second isolation structure is epitaxially grown on the second sensor layer. A third sensor layer is epitaxially grown on the second isolation structure.

Examples of the disclosure also include a non-transitory storage medium. The non-transitory storage medium stores instructions that, when executed by a processor, cause the processor to: control epitaxially growing, in a processing chamber, a first sensor layer on a crystalline surface on a substrate; control epitaxially growing, in the processing chamber, a first isolation structure on the first sensor layer; control epitaxially growing, in the processing chamber, a second sensor layer on the first isolation structure; control epitaxially growing, in the processing chamber, a second isolation structure on the second sensor layer; and control epitaxially growing, in the processing chamber, a third sensor layer on the second isolation structure.

Examples of the disclosure further include a device structure that includes a stacked pixel structure. The stacked pixel structure includes a first epitaxial sensor layer disposed on a crystalline surface on a substrate; a first epitaxial isolation structure disposed on the first epitaxial sensor layer; a second epitaxial sensor layer disposed on the first epitaxial isolation structure; a second epitaxial isolation structure disposed on the second epitaxial sensor layer; and a third epitaxial sensor layer disposed on the second epitaxial isolation structure.

BRIEF DESCRIPTION OF THE DRAWINGS

So that the manner in which the above recited features of the present disclosure can be understood in detail, a more particular description, briefly summarized above, may be had by reference to examples, some of which are illustrated in the appended drawings. It is to be noted, however, that the appended drawings illustrate only some examples and are therefore not to be considered limiting of the scope of this disclosure, for the disclosure may admit to other equally effective examples.

To facilitate understanding, identical reference numerals have been used, wherever possible, to designate identical elements that are common to the figures.

DETAILED DESCRIPTION

Generally, examples described herein relate to methods and processing chambers and systems for forming a stacked pixel structure using epitaxial growth processes and device structures formed thereby. In some examples, a stacked pixel structure can be formed by epitaxially growing a first sensor layer on a substrate, epitaxially growing a first isolation structure on the first sensor layer, epitaxially growing a second sensor layer on the first isolation structure, epitaxially growing a second isolation structure on the second sensor layer, and epitaxially growing a third sensor layer on the second isolation structure. The stacked pixel structure can be implemented as a pixel in a pixel array of an image sensor.

Stacked pixel technology can permit more light to reach a pixel in the pixel array because use of a color filter, which can absorb light, can be omitted. Generally, the sensor layers in a stacked pixel structure can be configured to absorb appropriate wavelengths of light (e.g., red (R) light, green (G) light, and blue (B) light) based on the arrangement and thicknesses of layers and natural property characteristics of the sensor layers. This can obviate the need for a color filter that previously was required in conventional image sensors to enable detection of particular wavelengths of light. Additionally, stacked pixel technology can enable a higher density array and/or larger pixel size since a given area can implement a pixel for multiple colors rather than a single color in conventional image sensors. Even further, stacked pixel technology can enable advanced technologies, such as RGB plus near infrared (NIR) on a same image sensor chip.

Some examples described herein can have additional benefits and advantages. A stacked pixel structure formed using epitaxial growth as described herein can result in a thin structure that is easily scaled. Isolation structures can be thin relative to the stacked pixel structure and can provide quantum confinement and material insulation. Interfaces between layers can be precisely defined by the epitaxial growth, and a wide range of materials can be used for the various layers for material engineering. Additionally, using epitaxial growth for layers can obviate crystalline damage that can result from other formation methods, such as can be caused by dopant implantation. Other benefits and advantages can be achieved.

Various different examples are described below. Although multiple features of different examples may be described together in a process flow or system, the multiple features can each be implemented separately or individually and/or in a different process flow or different system. Additionally, various process flows are described as being performed in an order; other examples can implement process flows in different orders and/or with more or fewer operations.

Figure 1:
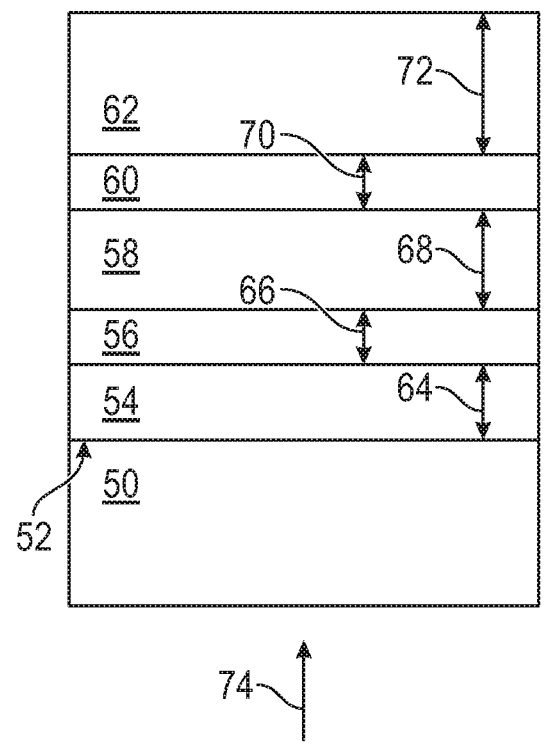
FIG. 1 depicts a cross-section of a stacked pixel structure disposed on a substrate according to some examples.

FIG. 1 depicts a cross-section of a stacked pixel structure disposed on a substrate 50 according to some examples. The substrate 50 can be any appropriate semiconductor substrate, such as a bulk substrate, semiconductor-on-insulator (SOI) substrate, or the like. In some examples, the substrate 50 is a bulk silicon wafer. Examples of substrate sizes include 200 mm diameter, 300 mm diameter, 400 mm diameter, and 450 mm diameter, among others. The substrate 50 includes a crystalline surface 52 on which the stacked pixel structure is formed. The crystalline surface 52 can be on a front side of the substrate 50 (in and/or on which devices, such as transistors, are formed), or can be on a backside of the substrate 50 opposite from the front side. The crystalline surface 52 is a crystalline surface (e.g., monocrystalline surface), such as Si(100), Si(110), or Si(111) when the substrate 50 is a bulk silicon wafer, that is used as a template for subsequent epitaxial growth. In some examples, the substrate 50 further includes an epitaxial buffer layer that forms the crystalline surface 52. In some examples, the crystalline surface 52 can be formed in a trench (e.g., a bottom surface of the trench) on a front side or backside of the substrate 50.

A first sensor layer 54 is disposed on the crystalline surface 52 of the substrate 50. The first sensor layer 54, in some examples, is an epitaxially grown semiconductor material, such as silicon, silicon germanium, or the like. The epitaxially grown semiconductor material can be doped, such as by in situ doping, as appropriate for a desired photon absorption and charge production. The epitaxially grown semiconductor material in such examples is epitaxially grown from the crystalline surface 52 of the substrate 50, such as by reduced pressure epitaxy (RPE), liquid phase epitaxy (LPE), molecular beam epitaxy (MBE), metal organic chemical vapor deposition (MOCVD), low pressure chemical vapor deposition (LPCVD), or the like.

A first isolation structure 56 is disposed on the first sensor layer 54. The first isolation structure 56 generally provides a level of electrical isolation between layers between which the first isolation structure 56 is disposed. In some examples, the first isolation structure 56 further provides a degree of optical isolation between layers between which the first isolation structure 56 is disposed. The first isolation structure 56 can be or include one or more quantum wells or an insulator material (e.g., a crystalline dielectric material). Additional details of examples of isolation structures are described below. The first isolation structure 56, in some examples, is or includes one or more epitaxially grown materials, which may be grown by RPE, LPE, MBE, MOCVD, LPCVD, atomic layer epitaxy (ALE), or the like.

A second sensor layer 58 is disposed on the first isolation structure 56. The second sensor layer 58, in some examples, is an epitaxially grown semiconductor material, such as silicon, silicon germanium, or the like. The epitaxially grown semiconductor material can be doped, such as by in situ doping, as appropriate for a desired photon absorption and charge production. The epitaxially grown semiconductor material in such examples is epitaxially grown from the first isolation structure 56, such as by RPE, LPE, MBE, MOCVD, LPCVD, or the like.

A second isolation structure 60 is disposed on the second sensor layer 58. The second isolation structure 60 generally provides a level of electrical isolation between layers between which the second isolation structure 60 is disposed. In some examples, the second isolation structure 60 further provides a degree of optical isolation between layers between which the second isolation structure 60 is disposed. The second isolation structure 60 can be or include one or more quantum wells or an insulator material (e.g., a crystalline dielectric material). Additional details of examples of isolation structures are described below. The second isolation structure 60, in some examples, is or includes one or more epitaxially grown materials, which may be grown by RPE, LPE, MBE, MOCVD, LPCVD, ALE, or the like.

A third sensor layer 62 is disposed on the second isolation structure 60. The third sensor layer 62, in some examples, is an epitaxially grown semiconductor material, such as silicon, silicon germanium, or the like. The epitaxially grown semiconductor material can be doped, such as by in situ doping, as appropriate for a desired photon absorption and charge production. The epitaxially grown semiconductor material in such examples is epitaxially grown from the second isolation structure 60, such as by RPE, LPE, MBE, MOCVD, LPCVD, or the like.

The first sensor layer 54, first isolation structure 56, second sensor layer 58, second isolation structure 60, and third sensor layer 62 have respective thicknesses 64, 66, 68, 70, 72 in a direction normal to the crystalline surface 52 of the substrate 50. The thicknesses 66, 70 can be small. For example, the formation of a quantum well or isolative properties of an insulator are theoretically irrespective of thickness of such quantum well or insulator, and hence, the thicknesses 66, 70 may be as small as practical in some examples. For example, the thicknesses 66, 70 may, in some examples, cumulatively be less than 5% of a total thickness of the stacked pixel structure (e.g., a sum of thicknesses 64, 66, 68, 70, 72). In other examples, the thicknesses 66, 70 can be any amount.

The thicknesses 64, 68, 72 of the first sensor layer 54, second sensor layer 58, and third sensor layer 62, respectively, can be a function of the wavelength of light the given layer is configured to absorb and from which charge is produced. A smaller thickness may be implemented to absorb shorter wavelength light, such as blue light, whereas a larger thickness may be implemented to absorb longer wavelength light, such as red light. Shorter wavelength light is generally absorbed within a shallower depth from incidence relative to longer wavelength light that is generally absorbed within a deeper depth from incidence. FIG. 1 illustrates a direction 74 of illumination. The direction 74 is a direction of propagation of light to be incident on the stacked pixel structure. As illustrated, light propagates in direction 74 through the substrate 50 to be incident on the stacked pixel structure at the crystalline surface 52. The first sensor layer 54 is configured to absorb shorter wavelength light (e.g., blue light); the second sensor layer 58 is configured to absorb intermediate wavelength light (e.g., green light); and the third sensor layer 62 is configured to absorb longer wavelength light (e.g., red light). Hence, as illustrated, the thickness 64 of the first sensor layer 54 is less than the thickness 68 of the second sensor layer 58, which is less than the thickness 72 of the third sensor layer 62. Respective materials and/or doping of the first sensor layer 54, second sensor layer 58, and third sensor layer 62 can be also be based on the wavelength of light that the first sensor layer 54, second sensor layer 58, and third sensor layer 62, respectively, are configured to absorb.

As indicated by the foregoing, each layer or structure of the stacked pixel structure can be epitaxially grown. In such examples, formation of such layers and structures can be precisely controlled. This can result in precise, sharp interfaces between adjoining layers and structures. Further, the isolation structures can be formed thin. For example, the thicknesses 66, 70 of the first isolation structure 56 and second isolation structure 60 can each be equal to or less than one percent of the sum of the thicknesses 64, 66, 68, 70, 72 of the first sensor layer 54, first isolation structure 56, second sensor layer 58, second isolation structure 60, and third sensor layer 62. This can further result in a stacked pixel structure that is relatively thin relative to other similar structures, which can permit the stacked pixel structure to be easily scaled to other applications. Additionally, implementing epitaxial growth can permit in situ doping, which can obviate using implantation of dopants. This can permit the stacked pixel structure to have an improved crystalline structure because damage to a crystalline structure caused by dopant implantation can be avoided.

Figure 2:
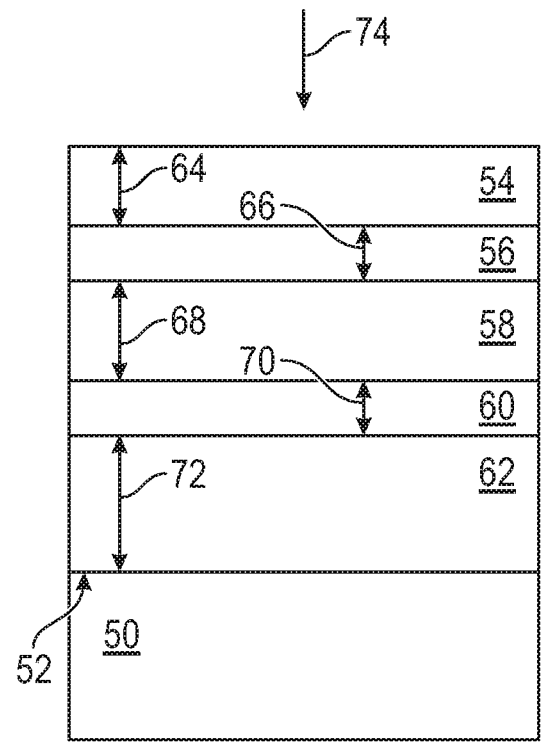
FIG. 2 depicts a cross-section of another stacked pixel structure disposed on a substrate according to some examples.

FIG. 2 depicts a cross-section of a stacked pixel structure disposed on a substrate 50 according to some examples. Generally, the orientation of layers and structures of the stacked pixel structure relative to the substrate 50 and crystalline surface 52 is flipped compared to FIG. 1.

The third sensor layer 62 is disposed on the crystalline surface 52 of the substrate 50. In some examples, an epitaxially grown semiconductor material of the third sensor layer 62 is epitaxially grown from the crystalline surface 52 of the substrate 50. The second isolation structure 60 is disposed on the third sensor layer 62. The second sensor layer 58 is disposed on the second isolation structure 60. In some examples, an epitaxially grown semiconductor material of the second sensor layer 58 is epitaxially grown from the second isolation structure 60. The first isolation structure 56 is disposed on the second sensor layer 58. The first sensor layer 54 is disposed on the first isolation structure 56. In some examples, an epitaxially grown semiconductor material of the first sensor layer 54 is epitaxially grown from the first isolation structure 56.

FIG. 2 further illustrates the direction 74 of illumination. As illustrated, light propagates in direction 74 and is incident on a surface of the first sensor layer 54 distal from the crystalline surface 52. A person having ordinary skill in the art will readily understand other aspect of FIG. 2 in view of the description of FIG. 1 above.

In some examples, the first sensor layer 54 in FIG. 1 and the third sensor layer 62 in FIG. 2 can be formed part of the substrate 50 in addition to or instead of epitaxially growing the respective layer on the substrate 50.

Figure 3:
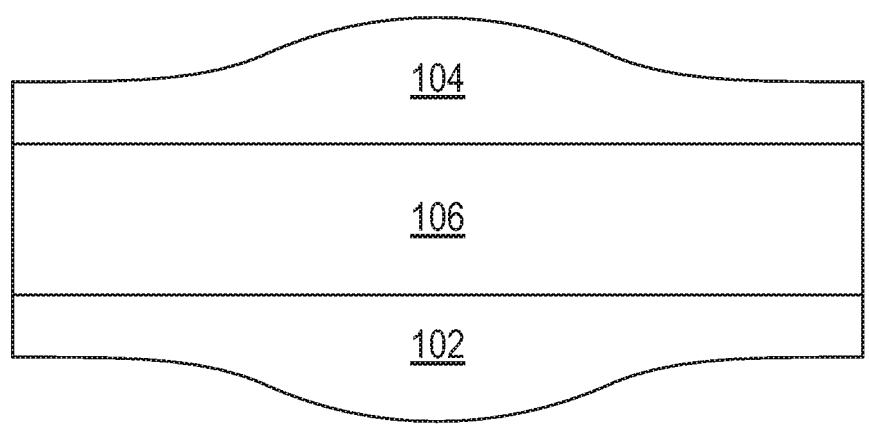
FIG. 3 depicts a quantum well layer as an example isolation structure of a stacked pixel structure according to some examples.
Figure 4:
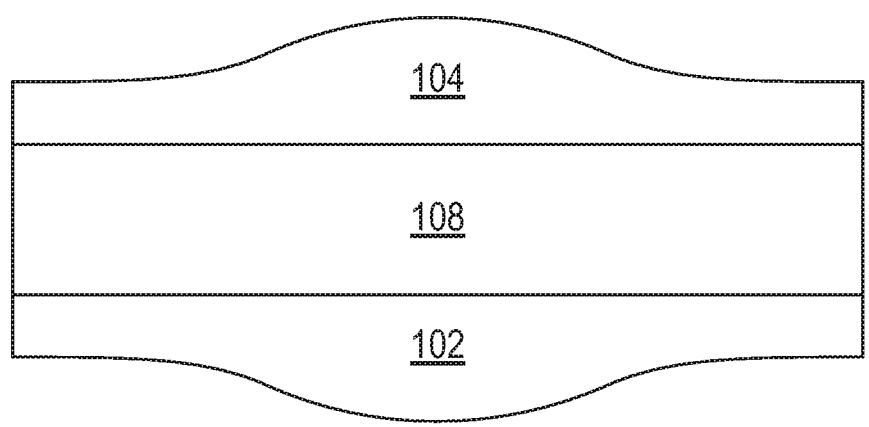
FIG. 4 depicts a crystalline dielectric layer as an example isolation structure of a stacked pixel structure according to some examples.
Figure 5:
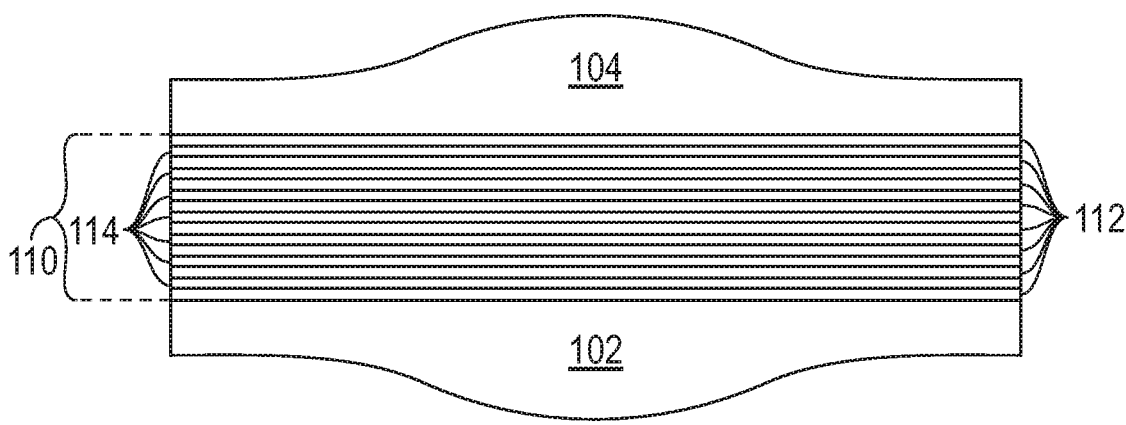
FIG. 5 depicts a superlattice structure as an example isolation structure of a stacked pixel structure according to some examples.

FIGS. 3, 4, and 5 depict different example isolation structures of a stacked pixel structure. Each of FIGS. 3, 4, and 5 illustrate respective portions of an underlying sensor layer 102 and an overlying sensor layer 104. In each of FIGS. 3, 4, and 5, an isolation structure is disposed between the underlying sensor layer 102 and the overlying sensor layer 104. The underlying sensor layer 102 is proximate to the crystalline surface 52 of the substrate 50, and the overlying sensor layer 104 is distal from the crystalline surface 52. The underlying sensor layer 102 can be, for example, the first sensor layer 54 or the second sensor layer 58 in the orientation of the stacked pixel structure illustrated in FIG. 1, and can be the third sensor layer 62 or the second sensor layer 58 in the orientation of the stacked pixel structure illustrated in FIG. 2. The overlying sensor layer 104 can be, for example, the second sensor layer 58 or the third sensor layer 62 in the orientation of the stacked pixel structure illustrated in FIG. 1, and can be the second sensor layer 58 or the first sensor layer 54 in the orientation of the stacked pixel structure illustrated in FIG. 2. The isolation structures in FIGS. 3, 4, and 5 can be any of the first isolation structure 56 and second isolation structure 60 in FIGS. 1 and 2. Further, the first isolation structure 56 and second isolation structure 60 can be any, including any mixture of, the isolation structures in FIGS. 3, 4, and 5. For example, the first isolation structure 56 can be the isolation structure in FIG. 3, while the second isolation structure 60 can be any of the isolation structures of FIGS. 3, 4, and 5. Also, the first isolation structure 56 can be the isolation structure in FIG. 4, while the second isolation structure 60 can be any of the isolation structures of FIGS. 3, 4, and 5. Even further, the first isolation structure 56 can be the isolation structure in FIG. 5, while the second isolation structure 60 can be any of the isolation structures of FIGS. 3, 4, and 5.

Referring to FIG. 3, a quantum well layer 106 is disposed between the underlying sensor layer 102 and the overlying sensor layer 104. The quantum well layer 106 has a different work function and/or bandgap energy from the underlying sensor layer 102 and the overlying sensor layer 104. Hence, when disposed between and adjoining the underlying sensor layer 102 and the overlying sensor layer 104, the underlying sensor layer 102, quantum well layer 106, and overlying sensor layer 104 form a quantum well. The quantum well provides a level of electrical isolation between the underlying sensor layer 102 and the overlying sensor layer 104.

In some examples, the quantum well layer 106 has a higher concentration of a p-type dopant (where electrons are the carriers of signals) or a higher concentration of an n-type dopant (where holes are the carriers of signals) than the underlying sensor layer 102 and the overlying sensor layer 104. For example, each of the underlying sensor layer 102 and the overlying sensor layer 104 may be doped with a p-type dopant, and the quantum well layer 106 has a higher concentration of a p-type dopant than each of the underlying sensor layer 102 and the overlying sensor layer 104. Further, each of the underlying sensor layer 102 and the overlying sensor layer 104 may be an intrinsic semiconductor material (e.g., un-doped), and the quantum well layer 106 may be doped with a p-type dopant. In some examples, the underlying sensor layer 102, overlying sensor layer 104, and quantum well layer 106 include a same base intrinsic semiconductor material. As a particular example, the underlying sensor layer 102 and overlying sensor layer 104 are each epitaxial intrinsic silicon, and the quantum well layer 106 is epitaxial p-doped silicon. In such an example, the p-type dopant can be boron, and the concentration of the p-type dopant in the quantum well layer 106 can be greater than $10^{17}$ cm$^{-3}$, such as in a range from $10^{17}$ cm$^{-3}$ to $10^{20}$ cm$^{-3}$. Similarly, each of the underlying sensor layer 102 and the overlying sensor layer 104 may be doped with an n-type dopant, and the quantum well layer 106 has a higher concentration of a n-type dopant than each of the underlying sensor layer 102 and the overlying sensor layer 104. Further, each of the underlying sensor layer 102 and the overlying sensor layer 104 may be an intrinsic semiconductor material, and the quantum well layer 106 may be doped with an n-type dopant. As a particular example, the underlying sensor layer 102 and overlying sensor layer 104 are each epitaxial intrinsic silicon, and the quantum well layer 106 is epitaxial n-doped silicon. In such an example, the n-type dopant can be phosphorus or arsenic, and the concentration of the n-type dopant in the quantum well layer 106 can be greater than $10^{17}$ cm$^{-3}$, such as in a range from $10^{17}$ cm$^{-3}$ to $10^{20}$ cm$^{-3}$.

Further, in such an example, the underlying sensor layer 102 can be epitaxially grown by flowing appropriate precursor gases, and when the thickness of the underlying sensor layer 102 has been reached, initiating (e.g., within a same processing chamber) flow of a p-type or n-type dopant source gas such that the quantum well layer 106 is epitaxially grown in situ doped. The p-type or n-type dopant source gas can be ceased when the thickness of the quantum well layer 106 has been reached, and growth of the overlying sensor layer 104 can begin.

In some examples, the quantum well layer 106 is a semiconductor material different from the underlying sensor layer 102 and the overlying sensor layer 104. The semiconductor material of the quantum well layer 106 has a band gap energy that is different from (e.g., larger or smaller than) the band gap energy of the underlying sensor layer 102 and the overlying sensor layer 104. It is noted that different semiconductor materials can have different natural lattice constants. When the quantum well layer 106 is epitaxially grown on the underlying sensor layer 102 and has a different natural lattice constant from the underlying sensor layer 102, the quantum well layer 106, in some examples, may not exceed its critical thickness. If the quantum well layer 106 exceeds its critical thickness, crystalline defects can be formed in the quantum well layer 106. Such crystalline defects can be propagated to any overlying layer, such as the overlying sensor layer 104, epitaxially grown on the quantum well layer 106. Further, if the thickness of the quantum well layer 106 does not exceed its critical thickness, the quantum well layer 106 may be strained. The quantum well layer 106 being strained can affect the band gap energy of the quantum well layer 106. Selection of materials of the various layers and thickness of the quantum well layer 106 can account for these considerations. As a particular example, the underlying sensor layer 102 and overlying sensor layer 104 are each epitaxial intrinsic silicon, and the quantum well layer 106 is epitaxial silicon germanium (SiGe), germanium (Ge), silicon phosphide (SiP), boron-doped silicon (Si:B), phosphorous-doped silicon (Si:P), arsenic-doped silicon (Si:As), carbon-doped silicon (Si:C), etc.

Further, in such an example, the underlying sensor layer 102 can be epitaxially grown by flowing appropriate precursor gases for the underlying sensor layer 102. When the thickness of the underlying sensor layer 102 has been reached, flow of those precursor gases can be ceased, and flow of appropriate precursor gases for the quantum well layer 106 can be initiated. When the thickness of the quantum well layer 106 has been reached, flow of those precursor gases can be ceased, and flow of appropriate precursor gases for the overlying sensor layer 104 can be initiated. The flowing of these different precursor gases to epitaxially grow the underlying sensor layer 102, quantum well layer 106, and overlying sensor layer 104 can be performed in a same processing chamber.

In further examples, the quantum well layer 106 can include a different base intrinsic semiconductor material from and have a higher p-type or n-type dopant concentration than the underlying sensor layer 102 and the overlying sensor layer 104. The various aspects described above can be combined.

Referring to FIG. 4, a crystalline dielectric layer 108 (e.g., monocrystalline) is disposed between the underlying sensor layer 102 and the overlying sensor layer 104. The crystalline dielectric layer 108 is electrically insulating. The crystalline dielectric layer 108 provides a level of electrical isolation between the underlying sensor layer 102 and the overlying sensor layer 104. The crystalline dielectric layer 108, in some examples, is a crystalline insulator material. For example, the crystalline dielectric layer 108 can be crystalline silicon oxide. Crystalline silicon oxide can be epitaxially grown using ALE. For example, a monolayer of silicon or a silicon-containing molecule can be formed on a crystalline surface by a pulse of an appropriate precursor gas, and subsequently, a monolayer of oxygen or an oxygen-containing molecule can be formed and/or reacted to on the monolayer of silicon or the silicon-containing molecule by a pulse of another appropriate precursor gas. These pulses can subsequently be alternated to grow crystalline silicon oxide. Like above, the underlying sensor layer 102, crystalline dielectric layer 108, and overlying sensor layer 104 can epitaxially grown in a same processing chamber.

Referring to FIG. 5, a superlattice structure 110 is disposed between the underlying sensor layer 102 and the overlying sensor layer 104. The superlattice structure 110 has alternating first layers 112 and second layers 114. The semiconductor material of the first layer 112 differs from the semiconductor material of the second layers 114. Any number of first layers 112 and second layer 114 can be implemented in the superlattice structure 110. The superlattice structure 110 includes multiple quantum wells. The quantum wells provide a level of electrical isolation between the underlying sensor layer 102 and the overlying sensor layer 104.

The superlattice structure 110 can further be a Bragg grating. The Bragg grating can operate as an optical filter. The materials of the first layers 112 and second layers 114 can be selected with appropriate refractive indexes to implement the Bragg grating as an optical filter. As an example, referring to FIGS. 1 and 2, the first isolation structure 56 implemented as a Bragg grating can be configured to reflect shorter wavelength light (e.g., blue light) while permitting longer wavelength light to pass, and the second isolation structure 60 implemented as a Bragg grating can be configured to reflect intermediate wavelength light (e.g., green light) while permitting longer wavelength light to pass. A Bragg grating implemented as the superlattice structure 110 can provide a degree of optical isolation between the underlying sensor layer 102 and the overlying sensor layer 104. A Bragg grating implemented as an isolation structure can permit the stacked pixel structure to be even thinner by achieving an improved efficiency with a thinner sensor layer since wavelengths of light can be selectively reflected by the isolation structure to the sensor layer.

Like above, the underlying sensor layer 102, superlattice structure 110, and overlying sensor layer 104 can epitaxially grown in a same processing chamber. Appropriate precursor gases can be flowed for a given layer (e.g., the underlying sensor layer 102, first layers 112, second layers 114, and overlying sensor layer 104) in an appropriate sequence to epitaxially grown the layers.

Figure 6:
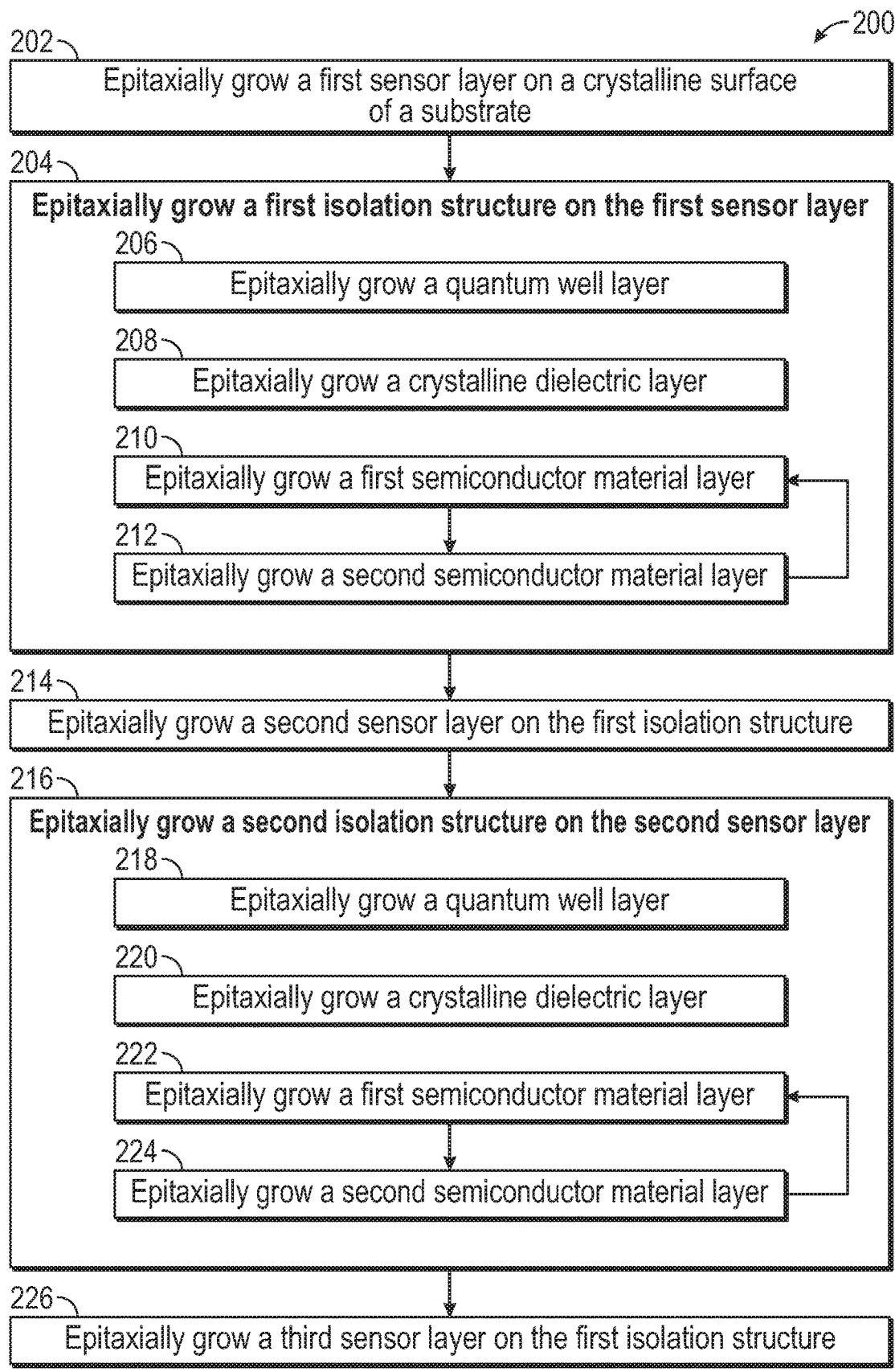
FIG. 6 is a flowchart of a method of forming a stacked pixel structure according to some examples.

FIG. 6 is a flowchart of a method 200 of forming a stacked pixel structure according to some examples. The description of the method 200 is general, and more detailed processing can be discerned from the preceding description.

At block 202, a first sensor layer is epitaxially grown on a crystalline surface of a substrate. For example, the first sensor layer 54 (FIG. 1) or third sensor layer 62 (FIG. 2) is epitaxially grown on the crystalline surface 52 of the substrate 50. In some examples, the first sensor layer can be formed part of the substrate in addition to or instead of epitaxially growing the first sensor layer on the substrate.

At block 204, a first isolation structure is epitaxially grown on the first sensor layer. For example, the first isolation structure 56 (FIG. 1) or second isolation structure 60 (FIG. 2) is epitaxially grown on the first sensor layer (e.g., first sensor layer 54 or third sensor layer 62, respectively). Block 204 includes blocks 206, 208, 210, 212, which may optionally be performed to form the first isolation structure. At block 206, a quantum well layer is epitaxially grown on the first sensor layer. For example, the quantum well layer can be or be like the quantum well layer 106 described with respect to FIG. 3. At block 208, a crystalline dielectric layer is epitaxially grown on the first sensor layer. For example, the crystalline dielectric layer can be or be like the crystalline dielectric layer 108 described with respect to FIG. 4. At block 210, a first semiconductor material layer is epitaxially grown, and at block 212, a second semiconductor material is epitaxially grown. Blocks 210 and 212 can be iteratively performed a number of times, e.g., to form a superlattice structure, such as a Bragg grating. For example, the first semiconductor material and the second semiconductor material can be or be like the first layer 112 and the second layer 114, respectively, of FIG. 5.

At block 214, a second sensor layer is epitaxially grown on the first isolation structure. For example, the second sensor layer 58 is epitaxially grown on the first isolation structure (e.g., first isolation structure 56 (FIG. 1) or second isolation structure 60 (FIG. 2)). At block 216, a second isolation structure is epitaxially grown on the second sensor layer. For example, the second isolation structure 60 (FIG. 1) or first isolation structure 56 (FIG. 2) is epitaxially grown on the second sensor layer 58. Block 216 includes blocks 218, 220, 222, 224, which may optionally be performed to form the second isolation structure. At block 218, a quantum well layer is epitaxially grown on the second sensor layer. For example, the quantum well layer can be or be like the quantum well layer 106 described with respect to FIG. 3. At block 220, a crystalline dielectric layer is epitaxially grown on the second sensor layer. For example, the crystalline dielectric layer can be or be like the crystalline dielectric layer 108 described with respect to FIG. 4. At block 222, a first semiconductor material layer is epitaxially grown, and at block 224, a second semiconductor material is epitaxially grown. Blocks 222 and 224 can be iteratively performed a number of times, e.g., to form a superlattice structure, such as a Bragg grating. For example, the first semiconductor material and the second semiconductor material can be or be like the first layer 112 and the second layer 114, respectively, of FIG. 5.

At block 216, a third sensor layer is epitaxially grown on the second isolation structure. For example, the third sensor layer 62 (FIG. 1) or first sensor layer 54 (FIG. 2) is epitaxially grown on the second isolation structure (e.g., second isolation structure 60 or first isolation structure 56, respectively).

FIGS. 7 through 12 illustrate various flowcharts and resulting structures that can implement the method 200 of FIG. 6 as examples. The description of these examples is at a high level of generality, and a person having ordinary skill in the art will readily understand more precise processing and/or structures that can be implemented.

Figure 7:
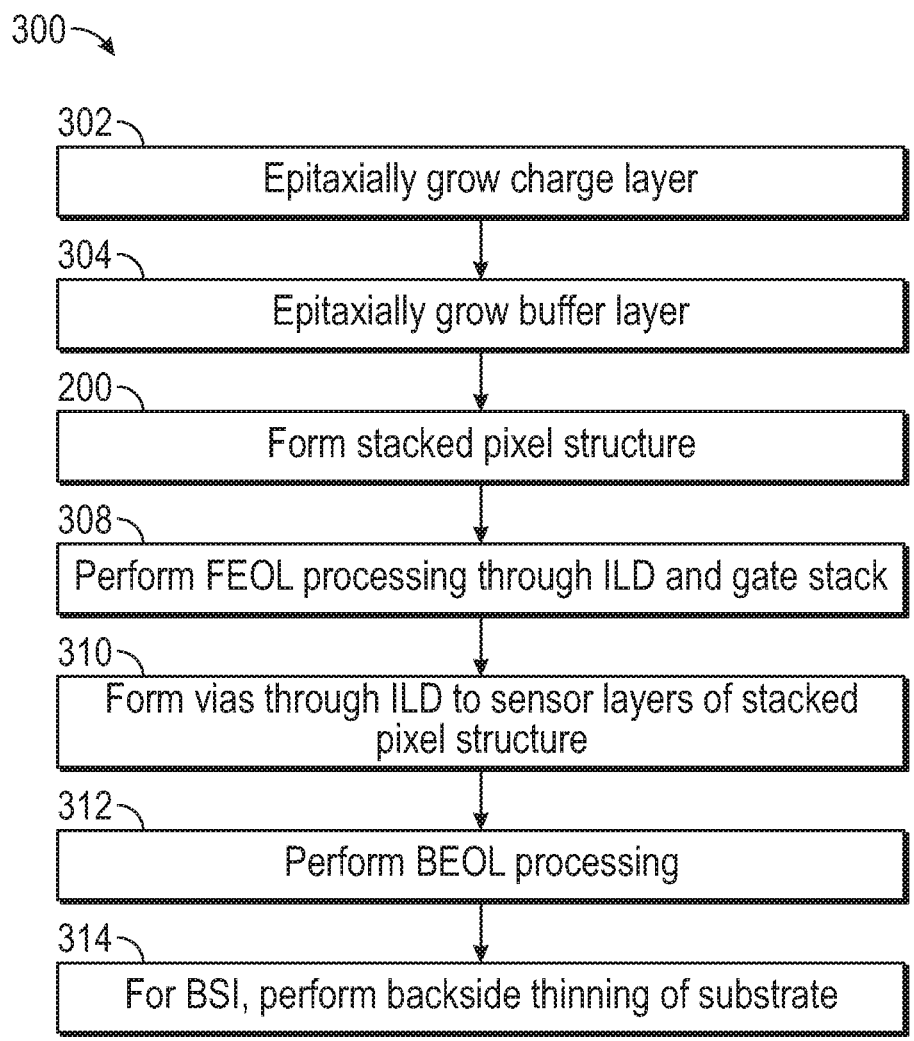
FIG. 7 is a flowchart of a method of forming a device structure that includes a stacked pixel structure according to some examples.
Figure 8:
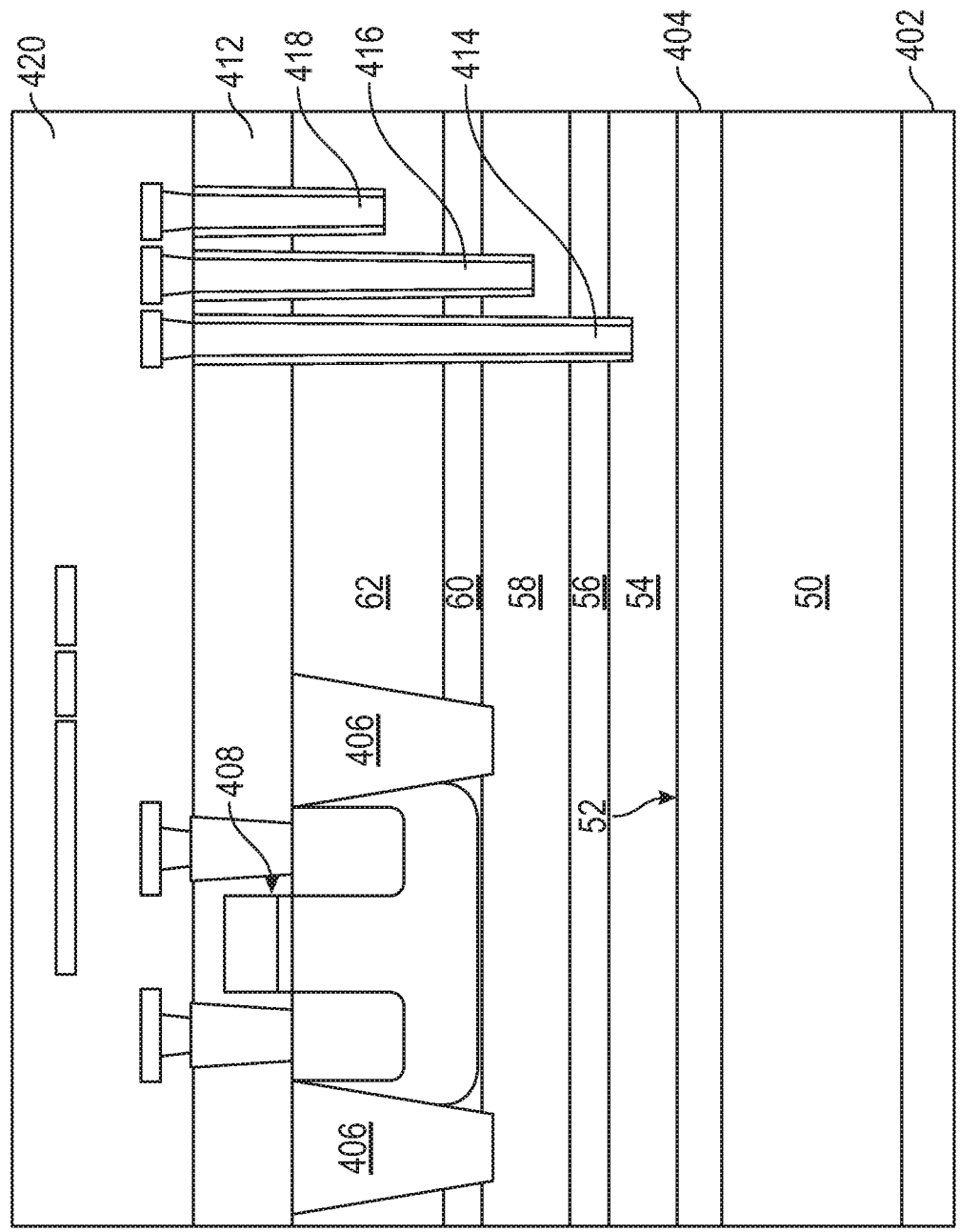
FIG. 8 is a cross-section of a device structure formed according to the method of FIG. 7 according to some examples.

FIG. 7 is a flowchart of a method 300 to form a device structure that includes a stacked pixel structure according to some examples. FIG. 8 is a cross-section of a device structure formed according to the method 300 of FIG. 7 according to some examples. The method 300 of FIG. 7 will be described in the context of the device structure of FIG. 8. The device structure of FIG. 8 is illustrated to be a back side illuminated (BSI) device, although the device structure can be modified to be a front side illuminated (FSI) device.

Referring to the method 300 of FIG. 7, at block 302, a charge layer is epitaxially grown on a backside surface of a substrate. As illustrated in FIG. 8, a charge layer 402 is epitaxially grown on the backside surface of the substrate 50. The charge layer can be omitted in some examples. The charge layer can be formed for purposes of providing an etch stop layer, for blocking metal contamination and diffusion, or for other purposes.

At block 304, a buffer layer is epitaxially grown on a front side surface of the substrate. As illustrated in FIG. 8, a buffer layer 404 is epitaxially grown on a front side surface of the substrate 50. The buffer layer can be omitted in some examples. The buffer layer can improve quality of a surface on which a stacked pixel structure is epitaxially grown. The buffer layer 404 therefore forms the crystalline surface 52 on which a stacked pixel structure will be epitaxially grown. In examples where the buffer layer is omitted, the substrate 50 can form the crystalline surface 52.

At method 200, a stacked pixel structure is formed, like described with respect to FIG. 6. As illustrated in FIG. 8, the stacked pixel structure includes the first sensor layer 54, first isolation structure 56, second sensor layer 58, second isolation structure 60, and third sensor layer 62. The stacked pixel structure illustrated in FIG. 8 is in the orientation relative to crystalline surface 52 that is illustrated in and described with respect to FIG. 1, which can be for a BSI device. In other examples, the stacked pixel structure can be in the orientation relative to crystalline surface 52 that is illustrated in and described with respect to FIG. 2, which can be for a FSI device.

At block 308, front end of the line (FEOL) processing is performed through forming an inter-layer dielectric (ILD) and gate stack. As illustrated in FIG. 8 as an example, isolation regions 406 are formed on the front side of the substrate 50, which in this example, is in and through the sensor layer and isolation structure (e.g., third sensor layer 62 and second isolation structure 60, respectively, as illustrated) most distal from the crystalline surface 52. Transistors (e.g., transistor 408) are formed in active regions defined by the isolation regions 406. Although not identified by reference numerals in FIG. 8, a doped well is formed in the sensor layer (e.g., third sensor layer 62) most distal from the crystalline surface 52 and extending into the isolation structure (e.g., second isolation structure 60) most distal from the crystalline surface 52. The transistor 408 includes source/drain regions in the doped well region and a gate stack disposed on the sensor layer most distal from the crystalline surface 52 and between the source/drain regions. The gate stack includes a gate dielectric disposed on the sensor layer most distal from the crystalline surface 52, and a gate electrode on the gate dielectric. A channel region is defined under the gate dielectric in the sensor layer most distal from the crystalline surface 52 and between the source/drain regions. One or more ILDs 412 are formed on the transistor 408 and the sensor layer most distal from the crystalline surface 52. Contacts or plugs are formed through the one or more ILDs 412 to the source/drain regions of the transistor 408.

A person having ordinary skill in the art will readily understand specific processes and materials that can be implemented in the FEOL processing in view of the foregoing description. For example, transistors can be planar field effect transistors (FETs) and/or three-dimensional or fin FETs. Processing can include gate first processing and/or replacement gate processing. Various other modifications to the processing and/or structure can be made.

At block 310, vias are formed through the ILD to respective sensor layers of the stacked pixel structure. As illustrated in FIG. 8, via 414 is formed to the sensor layer (e.g., first sensor layer 54) most proximate to the crystalline surface 52; via 416 is formed to the intermediate sensor layer (e.g., second sensor layer 58); and via 418 is formed to the sensor layer (e.g., third sensor layer 62) most distal from the crystalline surface 52. The vias 418 can be formed using an anisotropic etch process, such as a deep reactive ion etch (RIE), to form a via recess to an appropriate sensor layer. A passivation layer can then be conformally deposited, such as by atomic layer deposition (ALD), in the via recess and anisotropically etched such that the passivation layer remains on sidewalls of the via recess and is removed from a bottom surface of the via recess (e.g., an exposed surface of a sensor layer). A conductive material (e.g., a metal) is then deposited in the via recess contacting the exposed surface of the sensor layer and on the passivation layer on the sidewalls. Any conductive material deposited on the top surface of the ILDs 412 can be removed, such as by a chemical mechanical polish (CMP). A person having ordinary skill in the art will readily understand specific processes and materials that can be implemented to form the vias in view of the foregoing description.

At block 312, back end of the line (BEOL) processing is performed. As illustrated in FIG. 8, the BEOL processing forms an interconnect structure 420 on the ILD 412. The interconnect structure can include inter-metal dielectric (IMD) layers with metal layers including metal lines and/or vias disposed therein. The metal lines and vias can be connected in a way to connect the vias 414, 416, 418 to various transistors. A person having ordinary skill in the art will readily understand specific processes and materials that can be implemented to form the interconnect structure and perform BEOL processing in view of the foregoing description.

At block 314, for a BSI device, backside thinning of the substrate is performed. Block 314 can be omitted for a FSI device. The backside thinning can be performed by a CMP from the backside of the substrate. The backside thinning can remove the charge layer epitaxially grown at block 302 (e.g., illustrated as charge layer 402 in FIG. 8).

Figure 9:
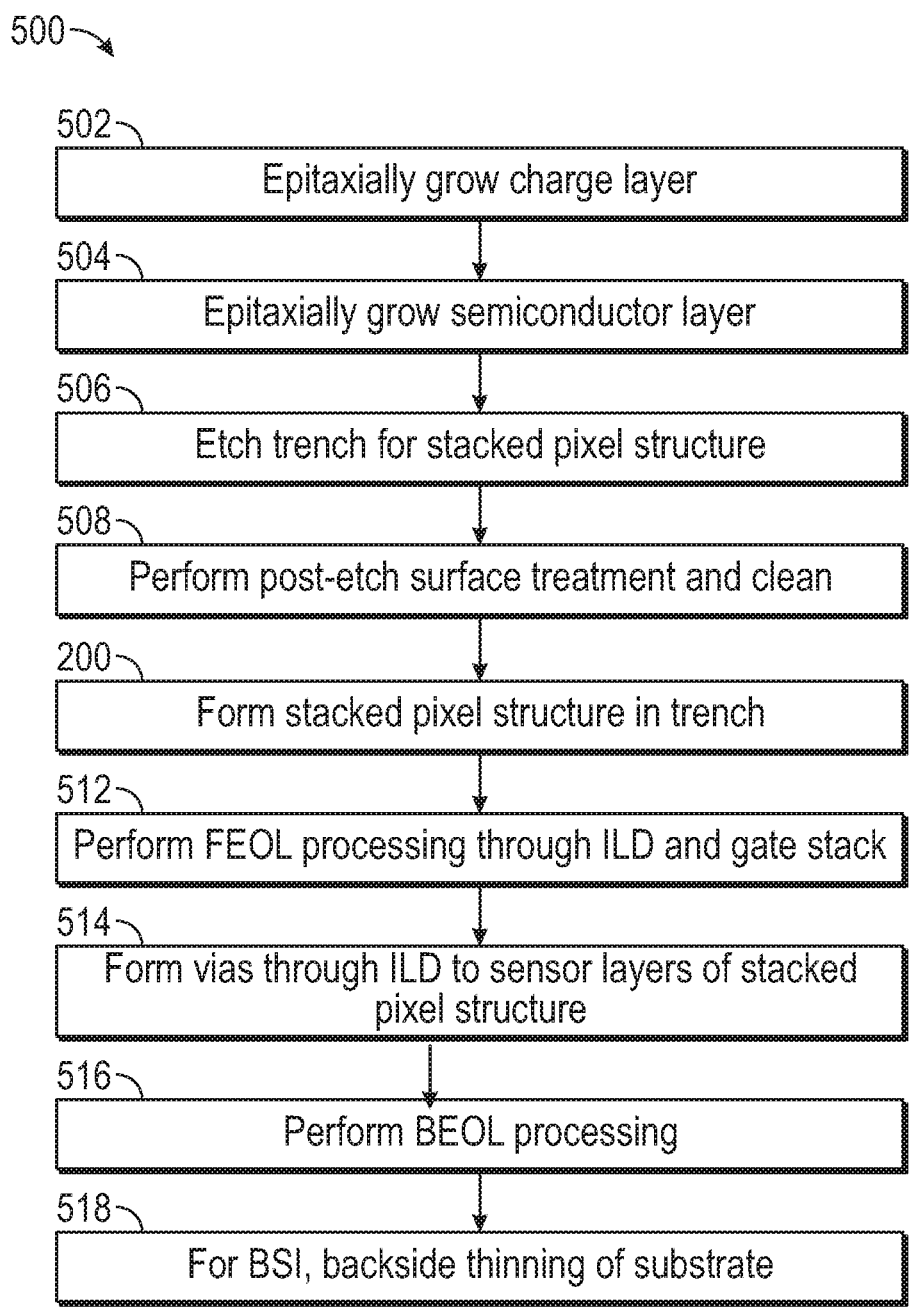
FIG. 9 is a flowchart of a method of forming a device structure that includes a stacked pixel structure according to some examples.
Figure 10:
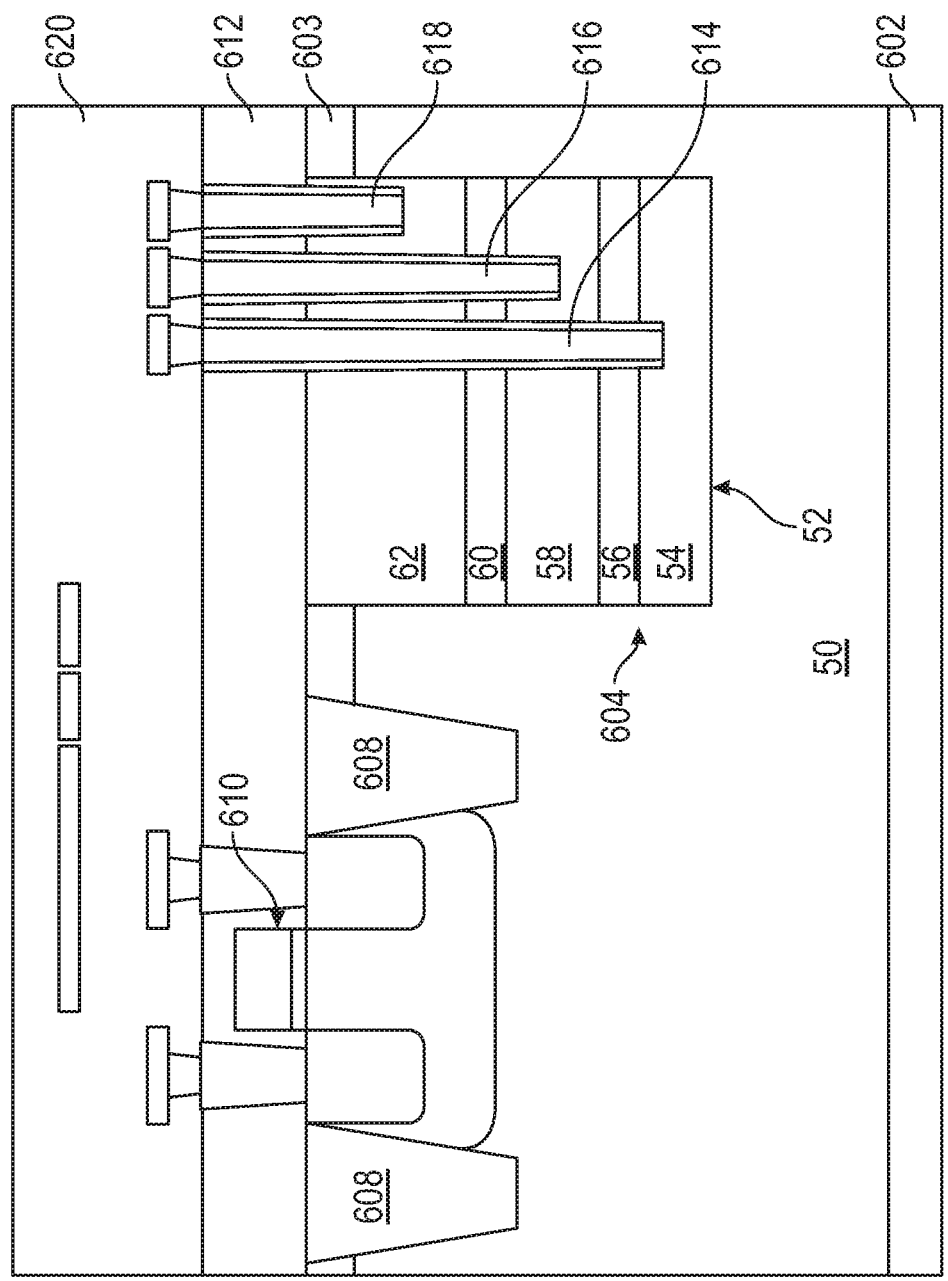
FIG. 10 is a cross-section of a device structure formed according to the method of FIG. 9 according to some examples.

FIG. 9 is a flowchart of a method 500 to form a device structure that includes a stacked pixel structure according to some examples. FIG. 10 is a cross-section of a device structure formed according to the method 500 of FIG. 9 according to some examples. The method 500 of FIG. 9 will be described in the context of the device structure of FIG. 10. The device structure of FIG. 10 is illustrated to be a BSI device, although the device structure can be modified to be a FSI device.

Referring to the method 500 of FIG. 9, at block 502, a charge layer is epitaxially grown on a backside surface of a substrate (like in block 302 of FIG. 7). As illustrated in FIG. 10, a charge layer 602 is epitaxially grown on the backside surface of the substrate 50. The charge layer can be omitted in some examples.

At block 504, a semiconductor layer is epitaxially grown on the front side surface of the substrate. As illustrated in FIG. 10, a semiconductor layer 603 is epitaxially grown on a front side surface of the substrate 50. The semiconductor layer can be omitted in some examples.

At block 506, a trench is etched in a front side of the substrate for a stacked pixel structure. As illustrated in FIG. 10, a trench 604 is etched through the semiconductor layer 603 (if present) and into the substrate 50, where the trench 604 is defined by sidewalls and a bottom surface formed by the substrate 50. The etch process can be any anisotropic etch process, such as an RIE. At block 508, a post-etch surface treatment and clean is performed. A person having ordinary skill in the art will readily understand the various processes that can be performed to etch, treat, and clean the trench. The bottom surface of the trench 604 (e.g., a surface of the substrate 50) forms the crystalline surface 52.

At method 200, a stacked pixel structure is formed, like described with respect to FIG. 6. As illustrated in FIG. 10, the stacked pixel structure includes the first sensor layer 54, first isolation structure 56, second sensor layer 58, second isolation structure 60, and third sensor layer 62. The stacked pixel structure illustrated in FIG. 10 is in the orientation relative to crystalline surface 52 that is illustrated in and described with respect to FIG. 1, which can be for a BSI device. In other examples, the stacked pixel structure can be in the orientation relative to crystalline surface 52 that is illustrated in and described with respect to FIG. 2, which can be for a FSI device.

At block 512, FEOL processing is performed through forming an ILD and gate stack. FIG. 10 illustrates isolation regions 608, a transistor 610, and one or more ILDs 612 as an example. Description of such components and processes to form such components can be like described above with respect to FIG. 8.

At block 514, vias are formed through the ILD to respective sensor layers of the stacked pixel structure. As illustrated in FIG. 10, via 614 is formed to the sensor layer (e.g., first sensor layer 54) most proximate to the crystalline surface 52; via 616 is formed to the intermediate sensor layer (e.g., second sensor layer 58); and via 618 is formed to the sensor layer (e.g., third sensor layer 62) most distal from the crystalline surface 52. Description of the vias 614, 616, 618 and processes to form the vias 614, 616, 618 can be like described above with respect to FIG. 8.

At block 516, BEOL processing is performed. As illustrated in FIG. 10, the BEOL processing forms an interconnect structure 620 on the ILD 612. Description of the interconnect structure 620 and processes to form the interconnect structure 620 can be like described above with respect to FIG. 8.

At block 518, for a BSI device, backside thinning of the substrate is performed. Block 518 can be omitted for a FSI device. The backside thinning can be performed by a CMP from the backside of the substrate. The backside thinning can remove the charge layer epitaxially grown at block 502 (e.g., illustrated as charge layer 602 in FIG. 10).

Figure 11:
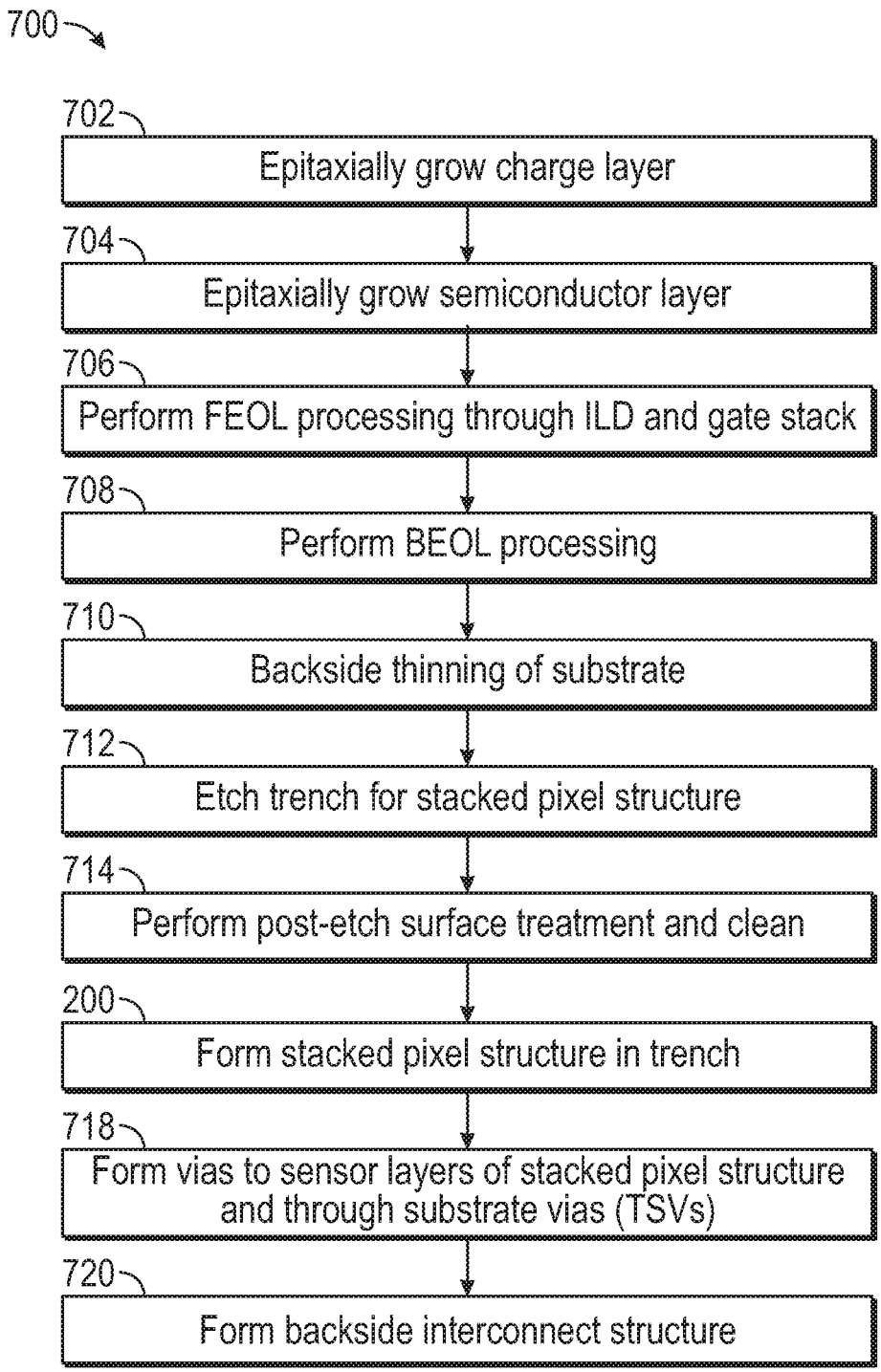
FIG. 11 is a flowchart of a method of forming a device structure that includes a stacked pixel structure according to some examples.
Figure 12:
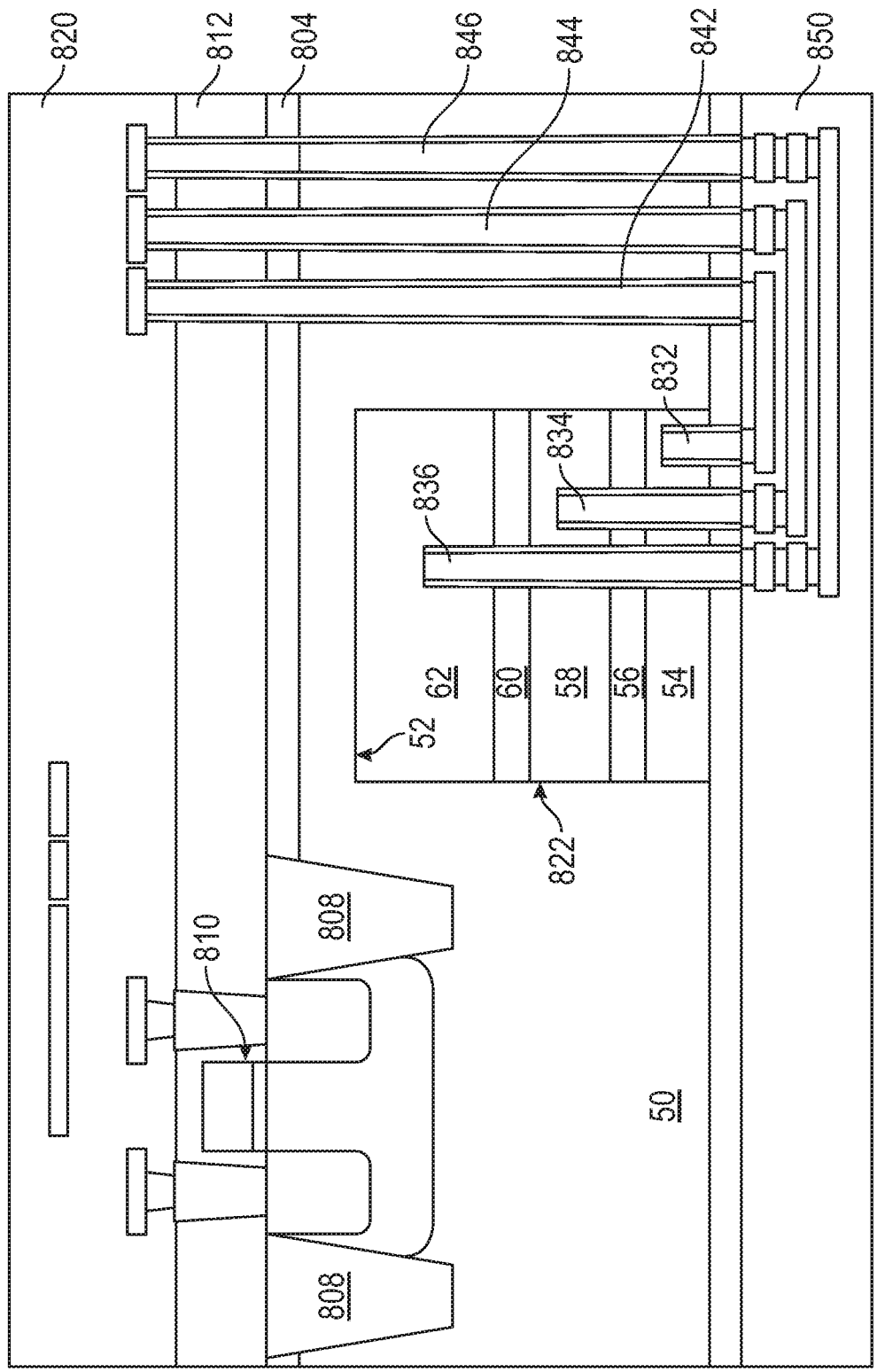
FIG. 12 is a cross-section of a device structure formed according to the method of FIG. 11 according to some examples.

FIG. 11 is a flowchart of a method 700 to form a device structure that includes a stacked pixel structure according to some examples. FIG. 12 is a cross-section of a device structure formed according to the method 700 of FIG. 11 according to some examples. The method 700 of FIG. 11 will be described in the context of the device structure of FIG. 12. The device structure of FIG. 12 is illustrated to be a BSI device, although the device structure can be modified to be a FSI device.

Referring to the method 700 of FIG. 11, at block 702, a charge layer is epitaxially grown on a backside surface of a substrate (like in block 302 of FIG. 7). A charge layer is epitaxially grown on the backside surface of the substrate 50, although not illustrated in FIG. 12 (for reasons described subsequently). The charge layer can be omitted in some examples.

At block 704, a semiconductor layer is epitaxially grown on the front side surface of the substrate. As illustrated in FIG. 12, a semiconductor layer 804 is epitaxially grown on a front side surface of the substrate 50. The semiconductor layer can be omitted in some examples.

At block 706, FEOL processing is performed through forming an ILD and gate stack. FIG. 12 illustrates isolation regions 808, a transistor 810, and one or more ILDs 812 as an example. Description of such components and processes to form such components can be like described above with respect to FIG. 8.

At block 708, BEOL processing is performed. As illustrated in FIG. 12, the BEOL processing forms a front side interconnect structure 820 on the ILD 812. Description of the front side interconnect structure 820 and processes to form the front side interconnect structure 820 can be like described above with respect to FIG. 8.

At block 710, backside thinning of the substrate is performed. The backside thinning can be performed by a CMP from the backside of the substrate. The backside thinning removes the charge layer epitaxially grown at block 702.

At block 712, a trench is etched in a backside of the substrate for a stacked pixel structure. As illustrated in FIG. 12, a trench 822 is etched into the substrate 50, where the trench 822 is defined by sidewalls and a bottom surface formed by the substrate 50. The etch process can be any anisotropic etch process, such as an RIE. At block 714, a post-etch surface treatment and clean is performed. A person having ordinary skill in the art will readily understand the various processes that can be performed to etch, treat, and clean the trench. The bottom surface of the trench 822 (e.g., a surface of the substrate 50) forms the crystalline surface 52.

At method 200, a stacked pixel structure is formed, like described with respect to FIG. 6. As illustrated in FIG. 12, the stacked pixel structure includes the first sensor layer 54, first isolation structure 56, second sensor layer 58, second isolation structure 60, and third sensor layer 62. The stacked pixel structure illustrated in FIG. 12 is in the orientation relative to crystalline surface 52 that is illustrated in and described with respect to FIG. 2, which can be for a BSI device. In other examples, the stacked pixel structure can be in the orientation relative to crystalline surface 52 that is illustrated in and described with respect to FIG. 1, which can be for a FSI device.

At block 718, vias are formed to respective sensor layers of the stacked pixel structure, and through-substrate vias (TSVs) are formed through the substrate to the front side interconnect structure. As illustrated in FIG. 12, via 832 is formed to the sensor layer (e.g., first sensor layer 54) most distal from the crystalline surface 52; via 834 is formed to the intermediate sensor layer (e.g., second sensor layer 58); and via 836 is formed to the sensor layer (e.g., third sensor layer 62) most proximate to the crystalline surface 52. Further, TSVs 842, 844, 846 are formed through the substrate 50 to, e.g., metal lines in the front side interconnect structure 820 on the front side of the substrate 50. A dielectric layer can be formed on the backside of the substrate 50 and on the stacked pixel structure, and recesses for forming the vias 832, 834, 836 and TSVs 842, 844, 846 can be formed through the dielectric layer. The process for forming the vias 832, 834, 836 and TSVs 842, 844, 846 can be like described above with respect the vias 414, 416, 418 of FIG. 8.

At block 720, a backside interconnect structure is formed. The backside interconnect structure includes dielectric layers in which metal lines and/or vias are disposed. The metal lines and/or vias electrically connect the vias connected to sensor layers of the stacked pixel structure to TSVs, which further are electrically connected to metal lines and/or vias in the front side interconnect structure. As illustrated in FIG. 12, a backside interconnect structure 850 is formed that includes metal lines and vias that electrically connect via 832 to TSV 842, via 834 to TSV 844, and via 836 to TSV 846. Processing to form the backside interconnect can be like described above for BEOL processing.

Figure 13:
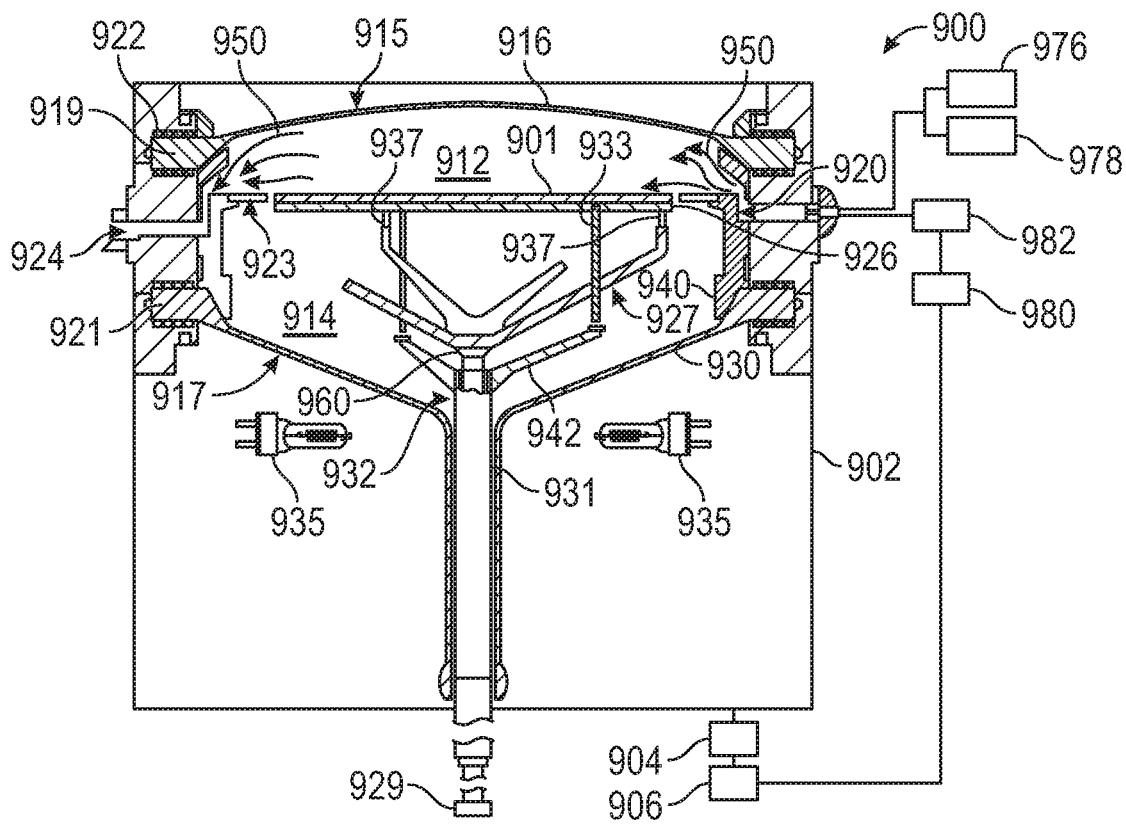
FIG. 13 is a cross-sectional view of a processing chamber that may be used to perform epitaxial growth according to some examples.

FIG. 13 is a cross-sectional view of a thermal processing chamber 900 that may be used to perform epitaxial growth. The processing chamber 900 can implement the epitaxial growth of the different layers and materials described above in the method 200 of FIG. 6. For example, the epitaxial growth of blocks 202, 204, 214, 216, 226 can be performed sequentially in the processing chamber 900, e.g., without removing the substrate from the processing chamber 900 and/or without breaking a vacuum of the processing chamber 900. In some examples, the processing chamber 1012 is a CENTURA® Reduced Pressure (RP) EPI chamber available from Applied Materials of Santa Clara, Calif.

The processing chamber 900 includes a chamber body 902, support systems 904, and a controller 906. The chamber body 902 includes an upper portion 912 and a lower portion 914. The upper portion 912 includes the area within the chamber body 902 between an upper dome 916 and a substrate 901. The lower portion 914 includes the area within the chamber body 902 between a lower dome 930 and the bottom of the substrate 901. Deposition processes generally occur on the upper surface of the substrate 901 within the upper portion 912.

The support system 904 includes components used to execute and monitor pre-determined processes, such as the growth of epitaxial layers or films in the processing chamber 900. A controller 906 is coupled to the support system 904 and is adapted to control the processing chamber 900 and support system 904. The controller 906 includes a processor (e.g., a central processing unit (CPU)), memory, and support circuits. The processor may be one of any form of a general purpose processor that can be used in an industrial setting. The memory, or non-transitory storage medium, is accessible by the processor and may be one or more of memory, such as random access memory (RAM), read only memory (ROM), floppy disk, hard disk, or any other form of digital storage, local or remote. The support circuits can be coupled to the processor and may comprise cache, clock circuits, input/output subsystems, power supplies, and the like. The various methods disclosed herein may generally be implemented under the control of the processor by the processor executing computer instruction code stored in the memory as, e.g., a software routine. When the computer instruction code is executed by the processor, the processor controls the processing chamber 900 to perform processes in accordance with various methods and operations, such as the method 200 of FIG. 6 described herein.

The processing chamber 900 includes a plurality of heat sources, such as lamps 935, which are adapted to provide thermal energy to components positioned within the processing chamber 900. For example, the lamps 935 may be adapted to provide thermal energy to the substrate 901, a susceptor 926, and/or the preheat ring 923. The lower dome 930 may be formed from an optically transparent material, such as quartz, to facilitate the passage of thermal radiation therethrough. It is contemplated that lamps 935 may be positioned to provide thermal energy through the upper dome 916 as well as the lower dome 930.

The chamber body 902 includes a plurality of plenums formed therein. The plenums are in fluid communication with one or more gas sources 976, such as a carrier gas, and one or more precursor sources 978, such as deposition gases and dopant gases. For example, a first plenum 920 may be adapted to provide a deposition gas 950 therethrough into the upper portion 912 of the chamber body 902, while a second plenum 924 may be adapted to exhaust the deposition gas 950 from the upper portion 912. In such a manner, the deposition gas 950 may flow parallel to an upper surface of the substrate 901.

In cases where a liquid precursor is used, the processing chamber 900 may include a liquid vaporizer 980 in fluid communication with a liquid precursor source 982. The liquid vaporizer 980 is be used for vaporizing liquid precursors to be delivered to the processing chamber 900. While not shown, it is contemplated that the liquid precursor source 982 may include, for example, one or more ampules of precursor liquid and solvent liquid, a shut-off valve, and a liquid flow meter (LFM).

A substrate support assembly 932 is positioned in the lower portion 914 of the chamber body 902. The substrate support assembly 932 is illustrated supporting a substrate 901 in a processing position. The substrate support assembly 932 includes a susceptor support shaft 927 formed from an optically transparent material and the susceptor 926 supported by the susceptor support shaft 927. A shaft 960 of the susceptor support shaft 927 is positioned within a shroud 931 to which lift pin contacts 942 are coupled. The susceptor support shaft 927 is rotatable in order to facilitate the rotation of the substrate 901 during processing. Rotation of the susceptor support shaft 927 is facilitated by an actuator 929 coupled to the susceptor support shaft 927. The shroud 931 is generally fixed in position, and therefore, does not rotate during processing. Support pins 937 couple the susceptor support shaft 927 to the susceptor 926.

Lift pins 933 are disposed through openings (not labeled) formed in the susceptor support shaft 927. The lift pins 933 are vertically actuatable and are adapted to contact the underside of the substrate 901 to lift the substrate 901 from a processing position (as shown) to a substrate removal position.

The preheat ring 923 is removably disposed on a lower liner 940 that is coupled to the chamber body 902. The preheat ring 923 is disposed around the internal volume of the chamber body 902 and circumscribes the substrate 901 while the substrate 901 is in a processing position. The preheat ring 923 facilitates preheating of a process gas as the process gas enters the chamber body 902 through the first plenum 920 adjacent to the preheat ring 923.

The central window portion 915 of the upper dome 916 and the bottom portion 917 of the lower dome 930 may be formed from an optically transparent material such as quartz. The peripheral flange 919 of the upper dome 916, which engages the central window portion 915 around a circumference of the central window portion 915, the peripheral flange 921 of the lower dome 930, which engages the bottom portion around a circumference of the bottom portion, may all be formed from an opaque quartz to protect the O-rings 922 proximity to the peripheral flanges from being directly exposed to the heat radiation. The peripheral flange 919 may be formed of an optically transparent material such as quartz.

Figure 14:
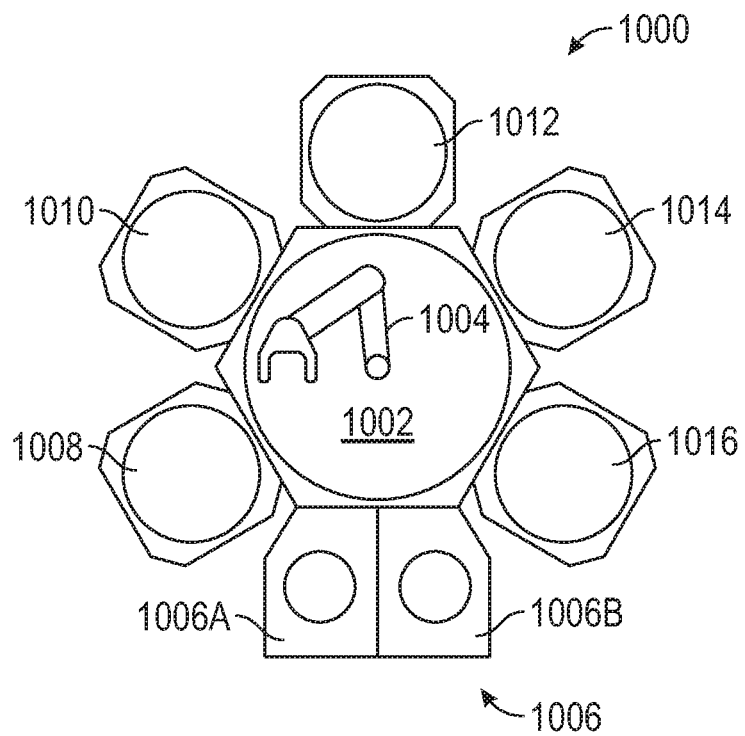
FIG. 14 is a schematic top view of a processing system according to some examples.

FIG. 14 is a schematic top view of a processing system 1000 that can be used to implement one or more operations of blocks or methods described herein, such as the operations of methods 200, 300, 500, 700 of FIGS. 6, 7, 9, and 11. In some examples, the processing system 1000 is the CENTURA® system available from Applied Materials, Inc., of Santa Clara, Calif.

A transfer robot 1004 is disposed in a transfer chamber 1002 of the processing system 1000. A load-lock 1006, with two load-lock chambers 1006A, 1006B is coupled to the transfer chamber 1002. A plurality of processing chambers 1008, 1010, 1012, 1014, 1016 are also coupled to the transfer chamber 1002. At least one of the processing chambers 1008, 1010, 1012, 1014, 1016 includes the processing chamber 900 described above with respect to FIG. 4, such as for implementing the method 200 of FIG. 6. Others of the processing chambers 1008, 1010, 1012, 1014, 1016 can be any appropriate processing chamber, such as for cleaning, etching, deposition, etc., which can implement other operations of, e.g., methods 300, 500, 700 of FIGS. 7, 9, and 11.

During processing, a substrate that is to be processed may arrive to the processing system 1000 in a pod (not shown). The substrate is transferred from the pod to the vacuum compatible load-lock chambers 1006A, 1006B by the factory interface robot (not shown). The substrate is then handled by the transfer robot 1004 in the transfer chamber 1002, which is generally kept in a vacuum state. The transfer robot 1004 then loads the substrate into any of the processing chambers 1008, 1010, 1012, 1014, 1016. The transfer robot 1004 is configured to pick up the substrate from any of the processing chambers 1008, 1010, 1012, 1014, 1016 and loads the substrate into another of the processing chambers 1008, 1010, 1012, 1014, 1016. The transfer robot 1004 is configured to transfer a substrate between different processing chambers for the different processing chambers to implement different processing on the substrate. Processing performed by the processing chambers 1008, 1010, 1012, 1014, 1016 and transfer of the substrate between the processing chambers 1008, 1010, 1012, 1014, 1016 can permit the substrate to not be exposed to atmosphere (e.g., vacuum is not broken) as the substrate is transferred to various processing chambers, which decreases the chance of contamination and improves the quality of the results of the processing.

The transfer chamber 1002 may remain under vacuum and/or at a pressure below atmosphere during the process. The vacuum level of the transfer chamber 1002 may be adjusted to match the vacuum level of corresponding processing chambers. For example, when transferring a substrate from a transfer chamber 1002 into a processing chamber (or vice versa), the transfer chamber 1002 and the processing chamber may be maintained at the same vacuum level. Then, when transferring a substrate from the transfer chamber to the load lock chamber or batch load lock chamber (or vice versa), the transfer chamber vacuum level may match the vacuum level of the load-lock chamber 1006A, 1006B even through the vacuum level of the load-lock chamber and the processing chamber may be different.

While the foregoing is directed to various examples of the present disclosure, other and further examples may be devised without departing from the basic scope thereof, and the scope thereof is determined by the claims that follow.

The invention claimed is:

1. A method for semiconductor processing, the method comprising:
    epitaxially growing a first sensor layer on a crystalline surface on a substrate;
    epitaxially growing a first isolation structure on the first sensor layer;
    epitaxially growing a second sensor layer on the first isolation structure;
    epitaxially growing a second isolation structure on the second sensor layer; and
    epitaxially growing a third sensor layer on the second isolation structure.

2. The method of claim 1, wherein the first sensor layer, the second sensor layer, and the third sensor layer form a stacked pixel structure.

3. The method of claim 1, wherein at least one of the first isolation structure and the second isolation structure is a quantum well layer.

4. The method of claim 1, wherein at least one of the first isolation structure and the second isolation structure is a crystalline dielectric layer.

5. The method of claim 1, wherein at least one of the first isolation structure and the second isolation structure is a superlattice structure.

6. The method of claim 5, wherein the superlattice structure is a Bragg grating.

7. The method of claim 1, wherein the crystalline surface is a surface of a buffer layer epitaxially grown on the substrate.

8. The method of claim 1, wherein the first sensor layer is configured to absorb red light, the second sensor layer is configured to absorb green light, and the third sensor layer is configured to absorb blue light.

9. The method of claim 1, wherein the first sensor layer is configured to absorb blue light, the second sensor layer is configured to absorb green light, and the third sensor layer is configured to absorb red light.

10. A non-transitory storage medium storing instructions that, when executed by a processor, cause the processor to:
    control epitaxially growing, in a processing chamber, a first sensor layer on a crystalline surface on a substrate;
    control epitaxially growing, in the processing chamber, a first isolation structure on the first sensor layer;
    control epitaxially growing, in the processing chamber, a second sensor layer on the first isolation structure;
    control epitaxially growing, in the processing chamber, a second isolation structure on the second sensor layer; and
    control epitaxially growing, in the processing chamber, a third sensor layer on the second isolation structure.

11. The non-transitory storage medium of claim 10, wherein the first sensor layer, the second sensor layer, and the third sensor layer form a stacked pixel structure.

12. The non-transitory storage medium of claim 10, wherein at least one of the first isolation structure and the second isolation structure is a quantum well layer.

13. The non-transitory storage medium of claim 10, wherein at least one of the first isolation structure and the second isolation structure is a superlattice structure.

14. The non-transitory storage medium of claim 13, wherein the superlattice structure is a Bragg grating.

15. The non-transitory storage medium of claim 10, wherein controlling epitaxially growing, in the processing chamber, at least one of the first isolation structure and the second isolation structure includes:
    iteratively:
        control epitaxially growing a first semiconductor material; and
        control epitaxially growing a second semiconductor material different from the first semiconductor material.

16. A device structure comprising:
    a stacked pixel structure comprising:
        a first epitaxial sensor layer disposed on a crystalline surface on a substrate;
        a first epitaxial isolation structure disposed on the first epitaxial sensor layer;
        a second epitaxial sensor layer disposed on the first epitaxial isolation structure;
        a second epitaxial isolation structure disposed on the second epitaxial sensor layer; and
        a third epitaxial sensor layer disposed on the second epitaxial isolation structure, wherein at least one of the first epitaxial isolation structure and the second epitaxial isolation structure is a crystalline dielectric layer.

17. The device structure of claim 16, wherein at least one of the first epitaxial isolation structure and the second epitaxial isolation structure is a quantum well layer.

18. The device structure of claim 16, wherein at least one of the first epitaxial isolation structure and the second epitaxial isolation structure is a superlattice structure.

19. The device structure of claim 18, wherein the superlattice structure is a Bragg grating.

* * * * *